(12) United States Patent
Yamamoto (10) Patent No.: US 8,203,358 B2
(45) Date of Patent: Jun. 19, 2012

(54) IMAGE PROCESSING APPARATUS, CONTROL METHOD, AND STORAGE MEDIUM

(75) Inventor: Naohiro Yamamoto, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/949,534

(22) Filed: Nov. 18, 2010

(65) Prior Publication Data

US 2011/0156751 A1    Jun. 30, 2011

(30) Foreign Application Priority Data

Dec. 28, 2009  (JP) .................................. 2009-298828

(51) Int. Cl.
*H03K 19/173*  (2006.01)
*H01L 25/00*  (2006.01)
(52) U.S. Cl. .......................................... 326/41; 326/38
(58) Field of Classification Search .............. 326/37–41, 326/47, 101
See application file for complete search history.

(56) References Cited

U.S. PATENT DOCUMENTS

| 7,330,985 | B2 | 2/2008 | Ohneda et al. |
| 7,434,074 | B2 | 10/2008 | Ohneda et al. |
| 7,461,279 | B2 | 12/2008 | Ohneda et al. |
| 7,600,140 | B2 | 10/2009 | Ohneda et al. |
| 7,936,184 | B2 * | 5/2011 | Lee et al. .......................... 326/41 |
| 2003/0071657 | A1 * | 4/2003 | Soerensen et al. .............. 326/93 |
| 2004/0213068 | A1 * | 10/2004 | Matsue .......................... 365/226 |

FOREIGN PATENT DOCUMENTS

JP     2005-136956 A     5/2005

* cited by examiner

*Primary Examiner* — Shawki S Ismail
*Assistant Examiner* — Thienvu Tran
(74) *Attorney, Agent, or Firm* — Fitzpatrick, Cella, Harper & Scinto (57) ABSTRACT

An image processing apparatus including a processing unit having a rewritable circuit arrangement, comprises a supply unit which supplies a voltage to the processing unit, a measurement unit which measures a magnitude of the voltage supplied from the supply unit to the processing unit, a control unit which rewrites the circuit arrangement of the processing unit in accordance with the magnitude of the voltage that is measured by the measurement unit.

7 Claims, 10 Drawing Sheets

IMAGE PROCESSING APPARATUS, CONTROL METHOD, AND STORAGE MEDIUM

BACKGROUND OF THE INVENTION

1. Field of the Invention

The present invention relates to an image processing apparatus, control method, and storage medium.

2. Description of the Related Art

Reduction of the power consumption and voltages of recent electronic devices promotes reducing power supply voltages supplied to rewritable devices typified by an FPGA. Also, multiple supply voltages are used because not only one but a plurality of voltage levels are available for a rewritable device along with the advance of multifunctional circuit operations for the rewritable device. Accordingly, the allowable fluctuation width of a supply voltage to a rewritable device becomes narrow, and stable quality is requested of a power supply voltage to be supplied.

The user can write circuit information in a rewritable device by a configuration operation. User-defined circuit information can be programmed in the rewritable device, implementing a circuit operation the user wants. After the rewritable device is powered, user-defined circuit information stored in advance in a memory typified by a ROM is written in the device by the configuration operation. However, when the power supply to the rewritable device is shut down and turned on again, the rewritable device returns to the initial state, so user-defined circuit information needs to be written again in the device by the configuration operation.

The configuration operation often requires a memory such as a ROM other than the rewritable device in order to transfer data of stored user-defined circuit information to the rewritable device. The rewritable device can define a supply power area for each circuit block in the device, and control the power supply for each area. In this case, circuit data is generated by designating mapping of circuit blocks to be written in the device to the same power supply area. The circuit data is stored in advance in a memory such as a ROM, and a circuit block can be generated for each specific power supply by the configuration operation.

In some cases, the rewritable device has function cells corresponding to a plurality of modes, and the voltage level is lower than that of a normal cell. The rewritable device generally operates at a voltage level lower than the driving voltage of an operation cell. In this case, the operation speed becomes lower than that of a normal operation cell. When, therefore, a low-power consumption cell is used, the operating frequency of a written user circuit becomes lower than that of a normal operation cell. However, if the user operates the rewritable device in consideration of the voltage level, the rewritable device operates without any trouble even using a low-power consumption cell as long as a circuit having an operating frequency corresponding to the voltage level is set. A low-power consumption cell and normal operation cell can be combined to create circuit data the user wants. In this case, user circuit data is generated by configuring a specific circuit using a low-power consumption cell and another specific circuit using a normal operation cell.

The power supply may unstably supply power to the rewritable device, or fall outside the allowable voltage range of the rewritable device. For example, the power supply state at a location where a rewritable device-embedded system is installed may be unstable, or the power supply on a rewritable device-embedded substrate may be unstable.

A rewritable device typified by an FPGA may malfunction if the supply voltage falls outside the device use range. If the supply power is lower than a specified one, the internal circuit of the rewritable device may be initialized. When the supply voltage to the rewritable device falls outside a specified level in a rewritable device-embedded system, processing in the rewritable device is sometimes locked and fails to output desired data. In this case, a destination circuit connected to the rewritable device falls into a special state. In this state, the whole system further malfunctions, and hangs up depending on the circumstances.

Upon generation of the hang-up, the system needs to be reset or powered again to return it. However, if the power supply voltage is in the same state as that before the return, the rewritable device becomes unstable again.

SUMMARY OF THE INVENTION

The present invention has been made to solve the above problems, and provides a technique of avoiding an unstable system state accompanying the operation of a rewritable device even when the supply voltage is unstable.

According to the first aspect of the present invention, an image processing apparatus including a processing unit having a rewritable circuit arrangement, comprising: a supply unit which supplies a voltage to the processing unit; a measurement unit which measures a magnitude of the voltage supplied from the supply unit to the processing unit; and a control unit which rewrites the circuit arrangement of the processing unit in accordance with the magnitude of the voltage that is measured by the measurement unit.

According to the second aspect of the present invention, a method of controlling an image processing apparatus including a processing unit having a rewritable circuit arrangement, comprising: a supply step of supplying a voltage to the processing unit; a measurement step of measuring a magnitude of the voltage supplied to the processing unit in the supply step; and a control step of rewriting the circuit arrangement of the processing unit in accordance with the magnitude of the voltage that is measured in the measurement step.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

<First Embodiment>

The arrangement of an electronic device which functions as an image processing apparatus and implements each embodiment of the present invention will be explained.

[Multi-function Peripheral]

Figure 1:
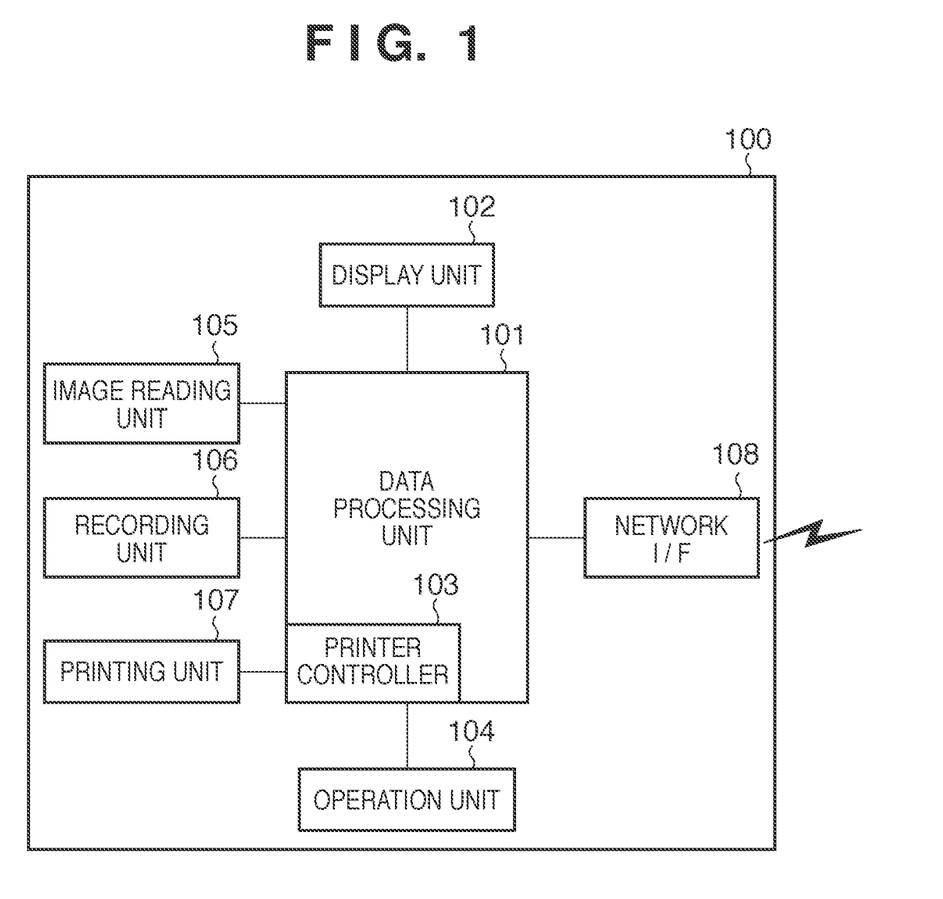
FIG. 1 is a block diagram showing the arrangement of an apparatus which performs a voltage reference operation.

FIG. 1 is a block diagram showing the arrangement of a multi-function peripheral serving as an electronic device according to the first embodiment.

A multi-function peripheral 100 is implemented by, for example, an image data processing apparatus which implements a plurality of kinds of functions. The multi-function peripheral 100 is connected to a network via a network I/F 108, and can transmit/receive image data and apparatus information using the network. An image reading unit 105 includes a platen and auto document feeder (ADF). A printing unit 107 has a copy function of printing image data on a recording medium such as paper.

A printer controller 103 performs various printing control operations of the printing unit 107. An operation unit 104 inputs an operator instruction to the multi-function peripheral 100. A display unit 102 displays an operation input state and image data during processing. A recording unit 106 stores data such as bitmap data obtained by processing image data.

A data processing unit 101 controls input/output operations for these functional units, and processes received data. In the multi-function peripheral 100, the display unit 102 and operation unit 104 implement a user interface for executing various processes to be described later.

[Data Processing Unit]

Figure 2:
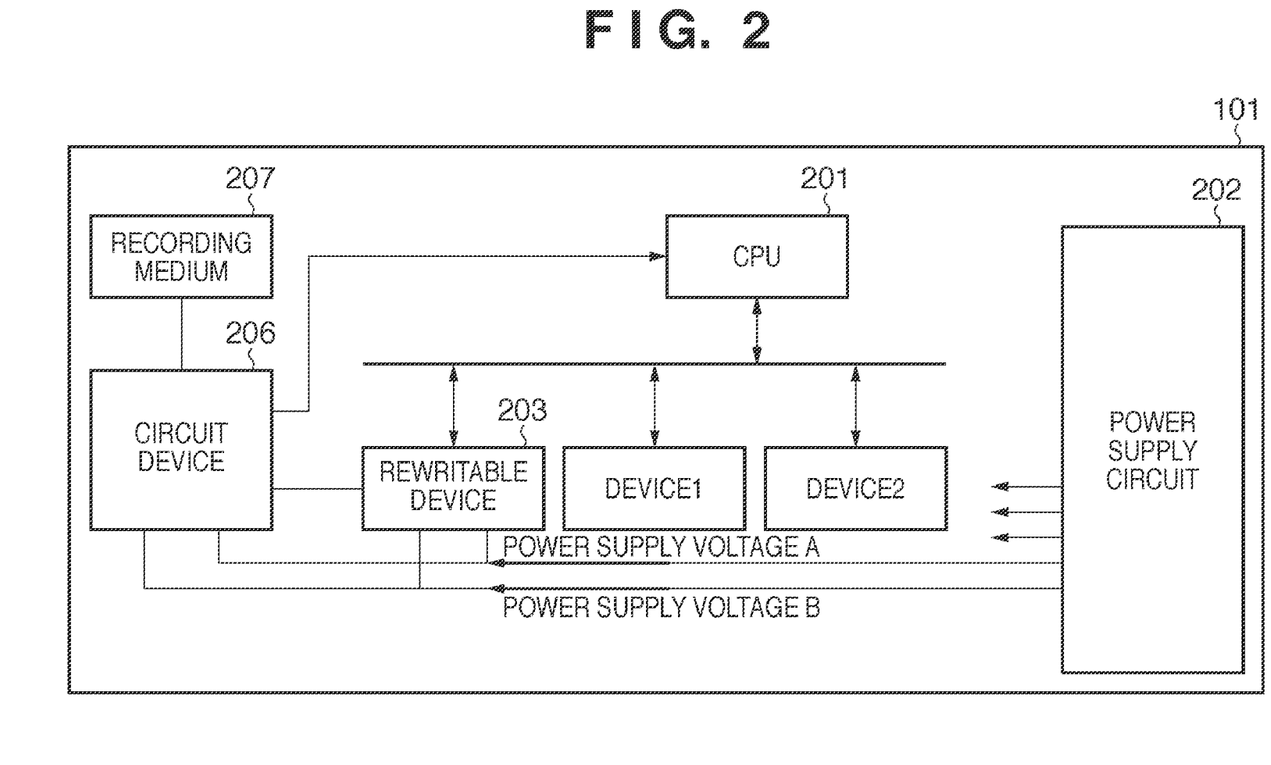
FIG. 2 is a block diagram showing the arrangement of a data processing unit.

The arrangement of the data processing unit 101 will be described with reference to FIG. 2. FIG. 2 is a block diagram showing the detailed arrangement of the data processing unit according to the first embodiment. The data processing unit 101 includes a CPU 201, connected devices 1 and 2, a rewritable device 203, a circuit device 206, a recording medium 207, and a power supply circuit 202.

The CPU 201 performs control for image data in accordance with a mode designated via the operation unit 104. The CPU 201 executes the control based on a control program stored in advance in a ROM for the CPU 201. The control program stored in the ROM is executed under the control of an OS (Operating System) for performing time-divisional control for each load module called a task based on the system clock. The control program includes a plurality of load modules, execution of which is controlled for each function by the OS.

Devices 1 and 2 perform image processing for image data using a hardware device such as an ASIC other than the rewritable device 203. The rewritable device 203 can write a user circuit by a plurality of times. That is, the rewritable device 203 implements a user-defined circuit operation by writing a user circuit in the device based on user-defined rewrite circuit data. Once a user circuit is written, the circuit operation is guaranteed as long as the rewritable device 203 receives power falling within a specified range. However, if the supplied power falls outside the specified range after write in the rewritable device, the operation of the rewritable device is not guaranteed. Especially when the power supply to the rewritable device stops, the operation of the rewritable device is initialized. In this case, the write operation (configuration operation) needs to be performed again.

The recording medium 207 stores a plurality of user-defined circuit data which correspond to fluctuations of the power supply voltage and are to be written in the rewritable device 203. The recording medium 207 uses a flash ROM or the like. A plurality of circuit data patterns each corresponding to the range of a power supply voltage supplied to the rewritable device 203 are prepared and stored in the recording medium 207.

The power supply circuit 202 is a block which supplies power to each device. In FIG. 2, the power supply circuit 202 is connected as power supply voltages A and B to the rewritable device 203. The power supply voltages A and B are also connected to the circuit device 206 in order to use them as voltages to be referred to for the rewritable device 203, which will be described later. The power supply circuit 202 supplies a plurality of power supply voltages necessary in the multi-function peripheral 100, in addition to the power supply voltages A and B. The power supply circuit 202 suppresses the fluctuation width within the specification of each device, and supplies a power supply voltage to each device. However, depending on the installation environment of the multi-function peripheral 100 and the hardware configuration of the data processing unit 101, the power supply circuit 202 may not be able to maintain a voltage level which satisfies the specification of each device.

For example, a voltage level which satisfies the specifications of each device may not be maintained when the quality of source power supplied to the power supply circuit 202 is not maintained and a voltage falling outside the guaranteed range is input to the power supply circuit 202. This also occurs when the data processing unit 101 is made up of a plurality of circuit boards, the power supply circuit 202 and rewritable device 203 are mounted on different circuit boards, and these boards are connected by a connector. That is, when a voltage loss and signal integrity between the circuit boards are not appropriately coped with, a large voltage difference is generated between the output voltage of the power supply circuit 202 and the input voltage of the rewritable device 203. Owing to this difference, the specification value of the input voltage to the rewritable device 203 may not be satisfied.

The circuit device 206 controls rewrite of user-defined circuit data in the rewritable device 203, and monitors a supply voltage to the rewritable device 203. Predetermined user-defined circuit data is written in the rewritable device 203 from the recording medium 207 in accordance with a request from the rewritable device 203 or CPU 201. Circuit data is written when the rewritable device 203 is powered or the level value of a supply voltage to the rewritable device 203 falls outside the specified range.

Upon power-on, the rewritable device 203 always requires an initialization (configuration) operation, so the circuit device always performs a circuit data write operation upon power-on. As a rewrite operation when the level of a supply voltage to the rewritable device 203 falls outside the specified range, the circuit device 206 writes circuit data in the rewritable device in accordance with a mechanism to be described later. The rewritable device 203 incorporates, in its circuit, function cells capable of corresponding to different power supply voltage ranges.

[User Circuit Pattern]

Figure 3:
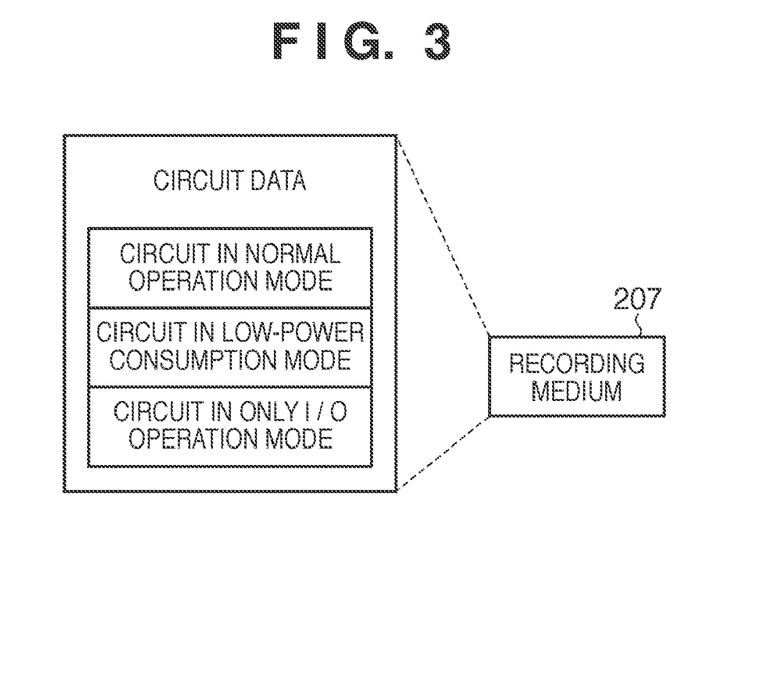
FIG. 3 is a view for explaining a circuit data storage recording unit.

The recording medium 207 includes a plurality of banks to hold a plurality of circuit data, and manages the memory to hold circuit data in each bank. Circuit data to be read out has a plurality of circuit data patterns. FIG. 3 exemplifies a rewrite circuit data pattern. Circuit data in the banks contain the following data:

circuit data in which circuits are configured to drive the function cells of all circuits as normal-voltage function cells circuit data in which low-power consumption function cells are mounted as the function cells of all circuits circuit data in which low-power consumption function cells are mounted as the function cells of some circuits circuit data in which the function cells of some circuits are not to be used circuit data in which only the I/O is driven and all the function cells of internal circuits are not used These circuit data are prepared in advance and stored in the recording medium 207. In storage, a storage area based on bank switching in the recording medium 207 is determined to read out only specific circuit data. Further, the circuit pattern information, start address, and end address of data to be read out as header information are recorded in part of each circuit data.

Based on the header information, the circuit device 206 selects desired circuit data in each circuit data pattern in the recording medium, reads out only the circuit data, and writes it in the rewritable device 203.

[Method of Referring to Voltage by Circuit Device]

A power supply voltage supplied to the rewritable device 203 is monitored by referring to it by the circuit device 206. As shown in FIG. 2, power supply voltages supplied from the power supply circuit 202 to the rewritable device are also supplied to the circuit device 206.

Figure 4:
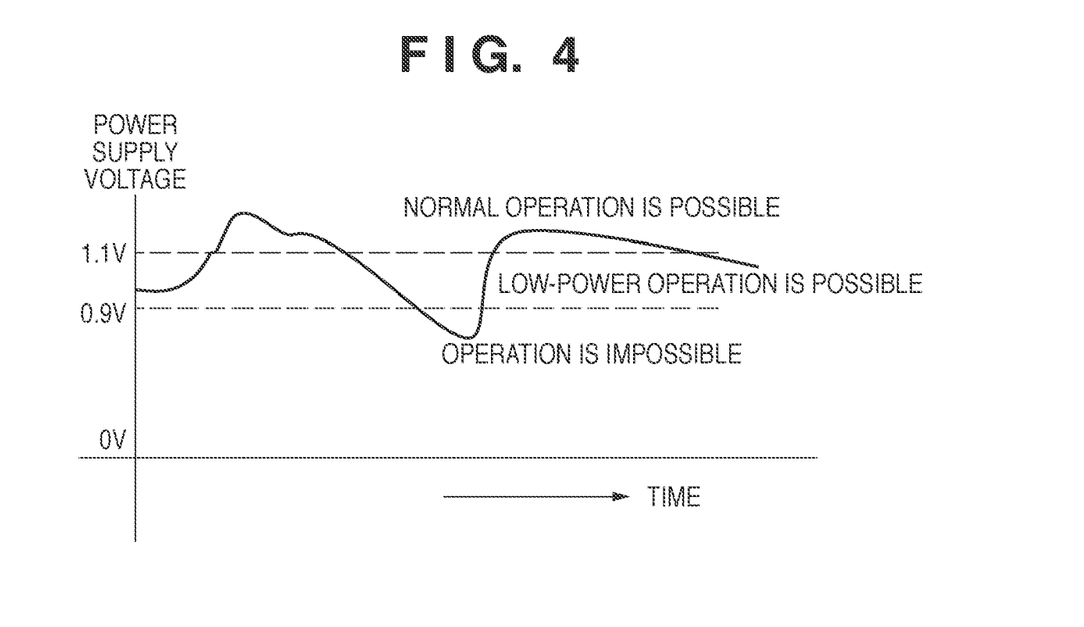
FIG. 4 is a graph for explaining fluctuations of the power supply voltage.

FIG. 4 exemplifies voltage fluctuations of the power supply. In the example of FIG. 4, a voltage value to the core circuit of the rewritable device is 1.1 V in a normal operation. When the voltage value ranges from 0.9 V to 1.1 V, it falls within a low-voltage operation range. When the voltage value is lower than 0.9 V, no circuit operation is guaranteed. In this case, at a power supply voltage of 1.1 V or more, a normal operation or the operation of a user circuit formed from a low-power consumption function cell is guaranteed. At a power supply voltage of 0.9 V (inclusive) to 1.1 V (exclusive), the operation of a user circuit formed from a low-power consumption function cell is guaranteed.

Figure 5:
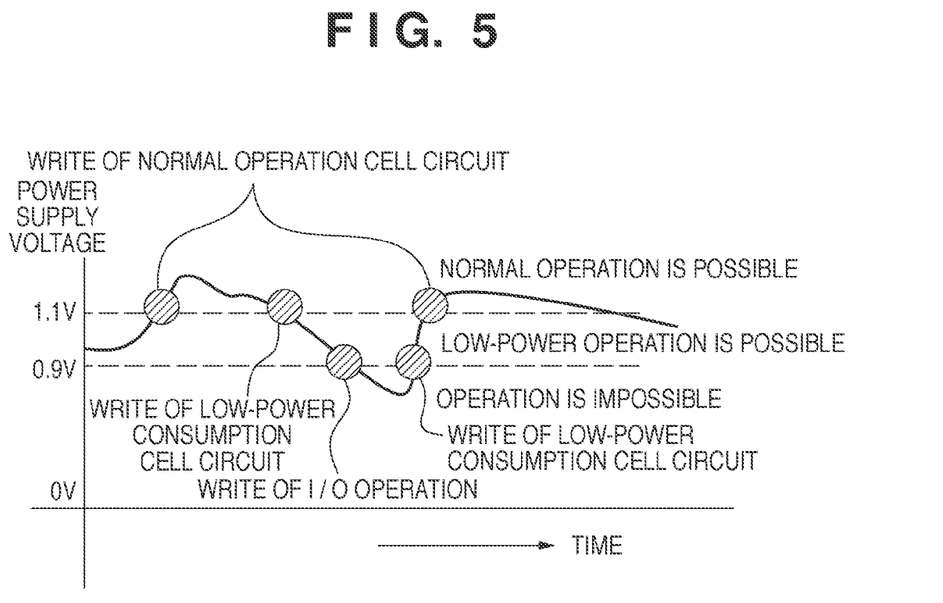
FIG. 5 is a graph for explaining a rewrite operation upon fluctuations of the power supply voltage.

FIG. 5 exemplifies rewrite of circuit data complying with voltage fluctuations of the power supply. When the voltage shifts from a predetermined power supply voltage range of lower than 1.1 V to a predetermined power supply voltage range of 1.1 V or more, the circuit data is switched to one formed from a normal operation function cell or one formed from a low-power consumption function cell. When the voltage shifts from the power supply voltage range of 1.1 V or more to a power supply voltage range of 0.9 V (inclusive) to 1.1 V (exclusive), the circuit data is switched to one formed from a low-power consumption function cell corresponding to this power supply voltage. When the voltage shifts to a power supply voltage range of lower than 0.9 V, no circuit operation is guaranteed, so the circuit data is switched to circuit data of an arrangement in which only the I/O is driven and all the function cells of internal circuits corresponding to this power supply range are not used. At this time, the power supply of the I/O is different from that of the function cell, and its power supply voltage is generally 3.3 V, which is higher than the level of a power supply voltage supplied to the core circuit.

Figure 6:
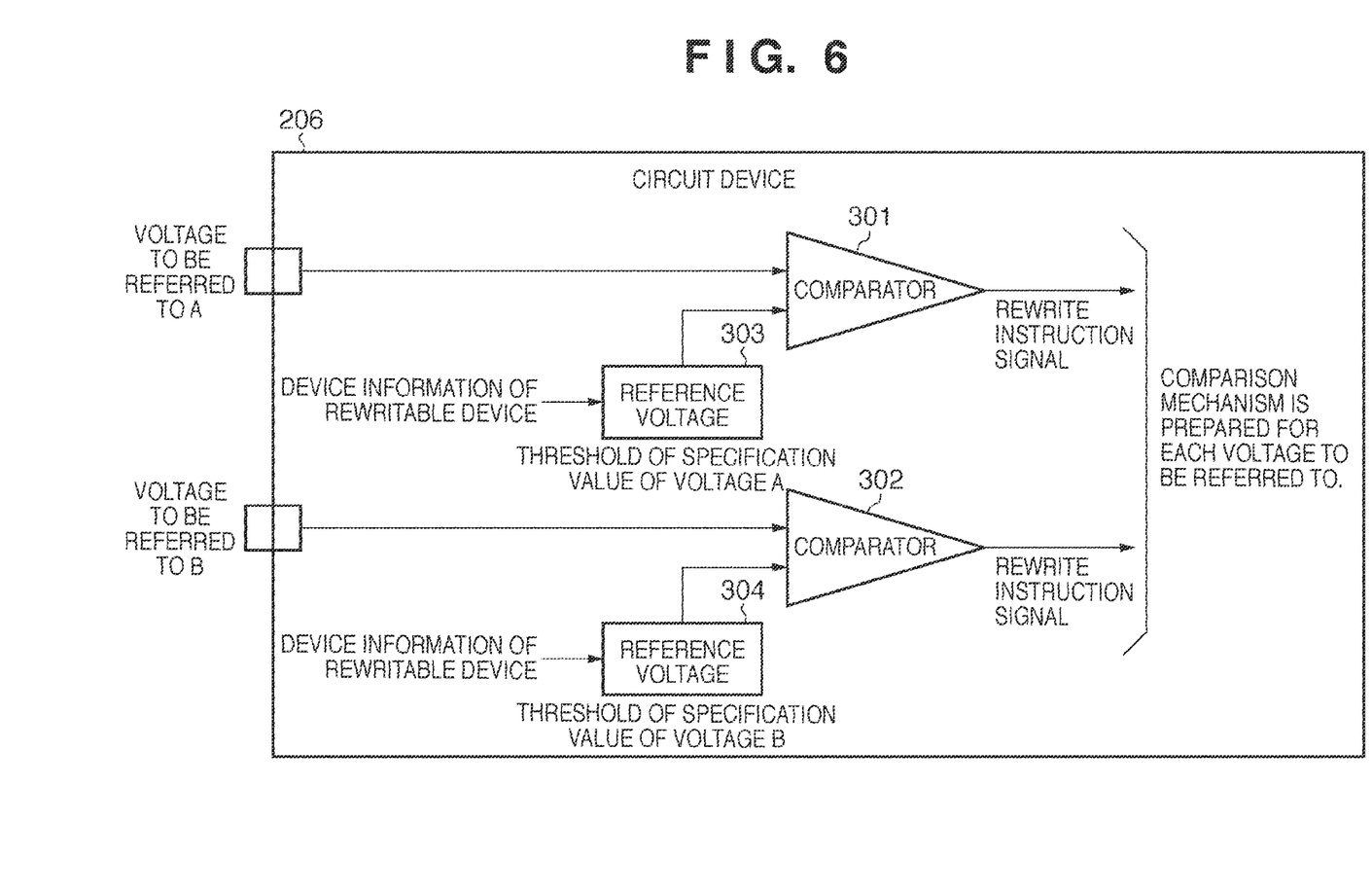
FIG. 6 is a circuit diagram for explaining monitoring of the power supply voltage.

A method of referring to a power supply voltage in the circuit device 206 of FIG. 2 will be explained with reference to FIG. 6. The power supply voltages A and B are respectively compared with reference voltages 303 and 304, and comparators 301 and 302 in the circuit device 206. When both the comparators 301 and 302 determine that the power supply voltages A and B exceed the ranges of the reference voltages 303 and 304, they output rewrite instruction signals to the CPU 201 (FIG. 2) to issue rewrite instructions. The reference voltages 303 and 304 are voltage level values based on a specified value uniquely determined in advance by the rewritable device 203 (FIG. 2). A reference voltage is prepared for each voltage to be referred to and is compared with it. Registers may be prepared in the circuit device 206 to variably set the values of the reference voltages 303 and 304.

[Rewrite of Circuit by Referring to Voltage of Rewritable Device]

Figure 7A:
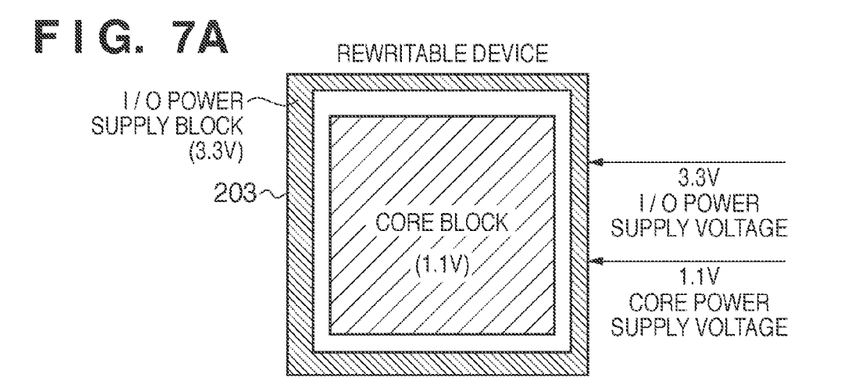
FIGS. 7A to 7C are views for explaining a circuit data rewrite method.

Rewrite of circuit data for the rewritable device 203 in FIG. 2 will be explained with reference to FIGS. 7A to 7C. FIG. 7A exemplifies the arrangement of the rewritable device 203. In this arrangement, the power supply voltage of the I/O of the rewritable device 203 is 3.3 V, and that of a core block including a processing function is 1.1 V.

In FIG. 7A, power supply voltages are maintained as the I/O power supply and core power supply to satisfy their specified values. Thus, a circuit formed from a normal operation function cell can be written in the core block, or one formed from a low-power consumption operation function cell can be written.

Figure 7B:
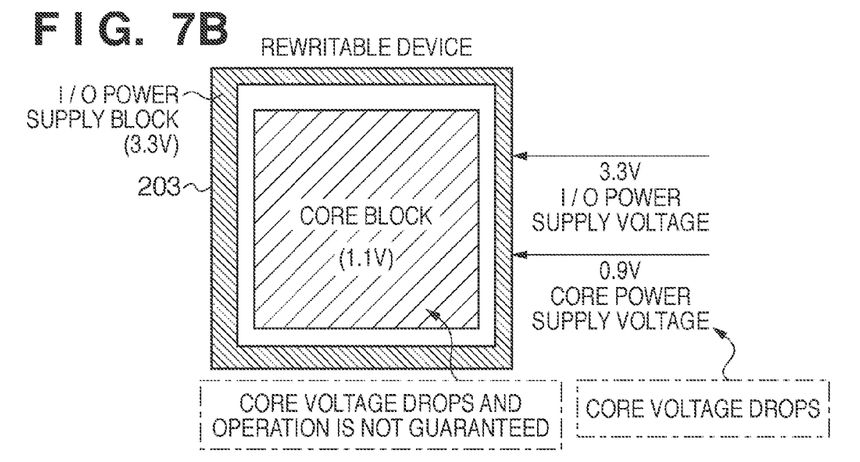

FIG. 7B exemplifies a case in which the power supply voltage supplied to the core block fluctuates from 1.1 V to 0.9 V. If the core power supply drops to 0.9 V, the core block of the rewritable device 203 cannot guarantee the operation of a circuit formed from a normal operation cell. Hence, the rewritable device 203 falls into an unstable state upon fluctuations of the core power supply voltage.

Figure 7C:
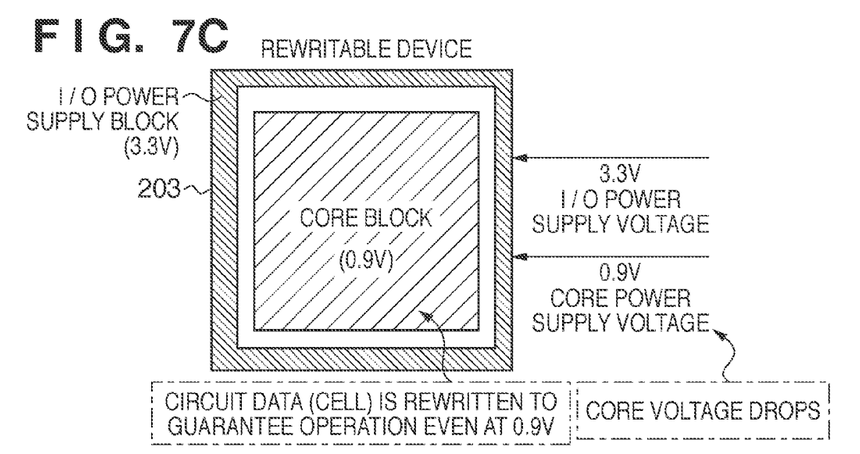

FIG. 7C exemplifies a case in which the core block is replaced with a low-power consumption operation function cell. Since the core power supply voltage drops to 0.9 V, the circuit device 206 rewrites circuit data of the rewritable device 203. More specifically, circuit data of the core block in the rewritable device 203 is rewritten from a circuit formed from a normal operation cell into one formed from a low-power consumption cell which can be driven at 0.9 V. As a result, even when the core power supply voltage is 0.9 V, the operation of the rewritable device 203 is guaranteed.

[Control Sequence]

Figure 8:
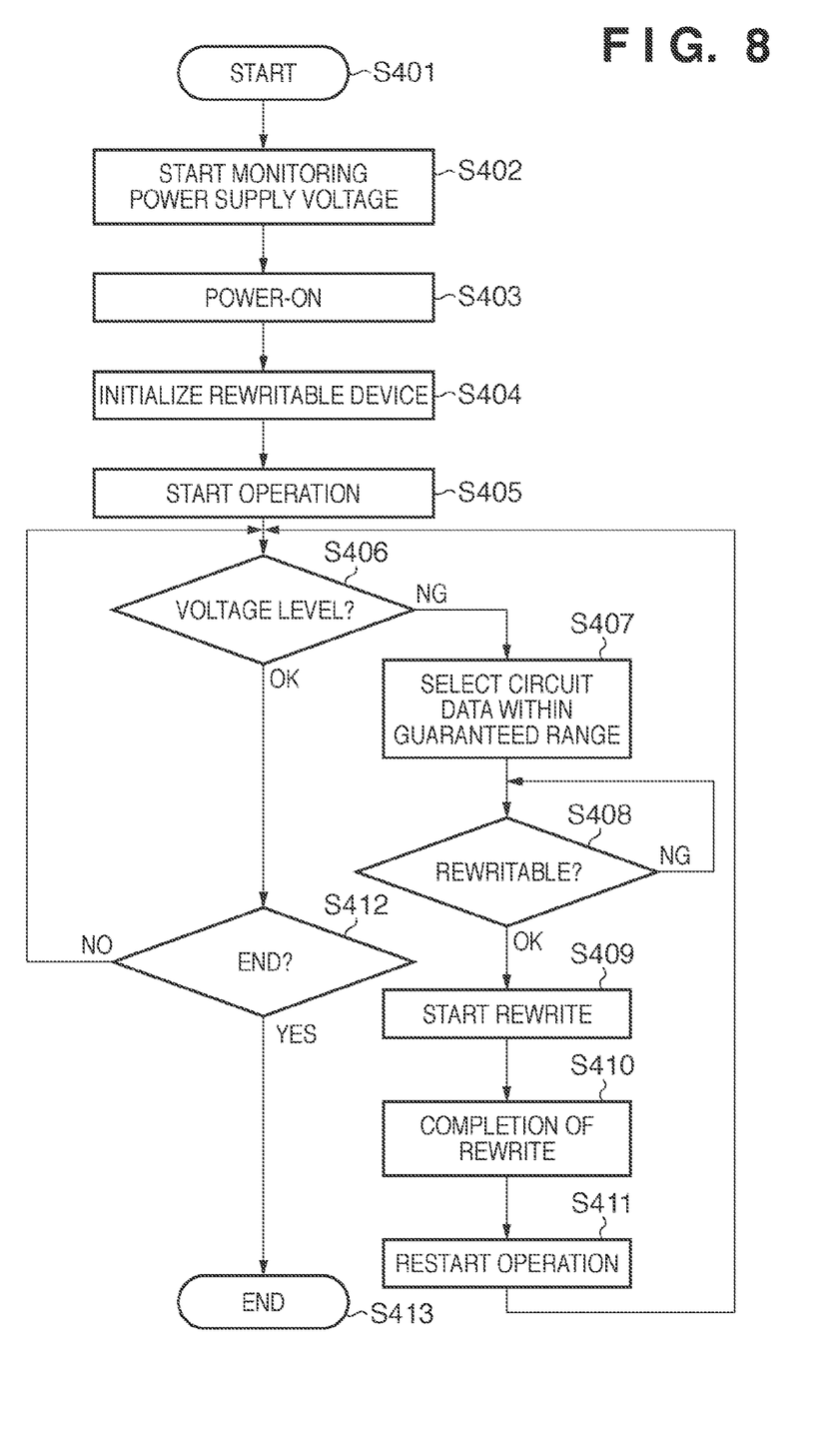
FIG. 8 is a flowchart of a circuit data rewrite method.

FIG. 8 is a flowchart of operation control according to the first embodiment. In S402, the circuit device 206 starts monitoring the power supply voltage of the rewritable device 203 in FIG. 2. In S403, the power supply circuit 202 (FIG. 2) starts supplying power supply voltages to the rewritable device 203.

After powering the rewritable device, the CPU 201 (FIG. 2) initializes (configures) the rewritable device in S404. At this time, user-defined circuit data is written in the rewritable device 203 via the circuit device 206 (FIG. 2). The circuit data written here is circuit data of a setting determined in advance as a default.

In S405, the circuit device 206 starts an operation for the rewritable device 203. In S406, the circuit device 206 keeps monitoring the level of each power supply voltage. If the voltage level falls outside the specified range of the rewritable device 203, the process shifts to S407 in order to perform circuit data rewrite/selection job. If the voltage level falls within the specified range of the rewritable device 203, the circuit device 206 keeps monitoring the voltage level till the end of the operation in S412.

In S407, the circuit device 206 selects circuit data within the guaranteed range from circuit data patterns prepared in advance. Upon completion of the selection, the circuit device 206 confirms in S408 whether the rewritable device 203 becomes rewritable. If YES (OK) in S408, the circuit device 206 starts rewriting the circuit data in S409.

If the rewrite of the circuit data ends in S410, the circuit device 206 restarts the monitoring operation of the supply voltage to the rewritable device in S411. Whether the rewrite of the circuit data is completed is determined based on rewrite completion notification information, similar to the completion of initializing the rewritable device 203 in S404.

[Case in which Plurality of Internal Voltage Areas Exist]

Figure 9:
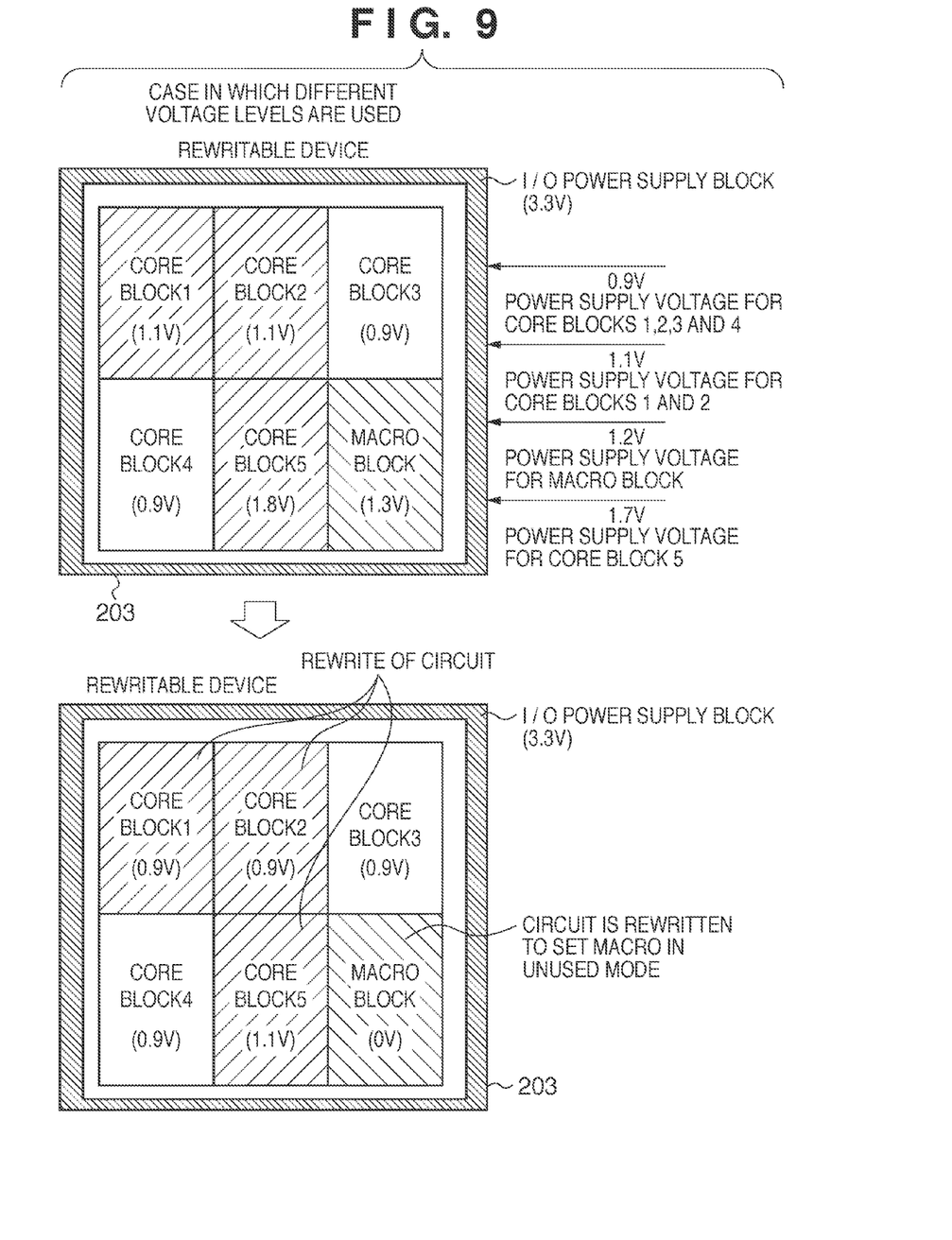
FIG. 9 is a view for explaining voltage control areas at multiple power supply voltages.

FIG. 9 shows a case in which the internal circuit of the rewritable device 203 is controlled by a plurality of voltages. In FIGS. 7A to 7C, the internal circuit, that is, core block of the rewritable device 203 is controlled by a single voltage. In the example of FIG. 9, the rewritable device 203 includes the circuit blocks of core blocks 1 to 5, and the macro block of a circuit block defined by a macro in advance.

In this case, core blocks 1 and 2 operate at a power supply voltage of 1.1 V, and core block 5 operates at a power supply voltage of 1.8 V. Core blocks 3 and 4 operate at a power supply voltage of 0.9 V, and the macro block operates at a power supply voltage of 1.3 V. In this example, power supply voltages supplied to core blocks 1, 2, 3, and 4 fluctuate to be 0.9 V. Also, a power supply voltage supplied to core block 5 fluctuates to be 1.7 V, and that supplied to the macro block fluctuates to be 1.2 V. In the rewritable device 203, therefore, the operations of core blocks 1, 2, 5, and macro block are not guaranteed.

Hence, the circuit device 206 rewrites circuit data of a block for which the power supply voltage level is short, into circuit data capable of operation at a supplied power supply voltage. More specifically, core blocks 1 and 2 are formed from low-power consumption operation function cells which are driven at 0.9 V. Core block 5 is formed from a low-power consumption operation function cell which is driven at 1.1 V. If a function cell drivable at 1.2 V is not prepared, the macro block is switched to an unused mode and is replaced with a circuit in the unused state in which only input/output I/F processing of the macro block is done.

Accordingly, the operation of the rewritable device 203 shifts to a state in which it is guaranteed within a supplied power supply voltage range. In this case, however, the use of the macro block is inhibited, and the operations of some of circuit functions written in the rewritable device 203 are limited.

<Second Embodiment>

An electronic device which implements the second embodiment has the same arrangement as that in the first embodiment. In the second embodiment, a difference from the first embodiment will be mainly explained.

[Selection of Low-power Consumption Mode]

In an initial stage before the start of operation, a voltage level supplied from a power supply circuit 202 to a rewritable device 203 in a data processing unit 101 in FIG. 2 is determined. More specifically, a circuit device 206 monitors and determines a voltage level supplied to the rewritable device 203 upon power-on. At this time, the circuit device 206 determines whether a voltage supplied to the rewritable device 203 falls within the specified supply voltage range of a low-power consumption function cell.

If the supply voltage level falls within the specified supply voltage range of a low-power consumption cell, the circuit device 206 selects, for use, either circuit data using a low-power consumption function cell or circuit data using a normal operation function cell.

The circuit device 206 transmits notification information of the supply voltage level result to a display unit 102 via a CPU 201 in FIG. 2. The display unit 102 notifies the user that a power consumption-suppressed operation mode is possible. The user interface is configured to display choices for using the power consumption-suppressed operation mode or the normal operation mode, and allow the user to select either operation mode.

Figure 10:
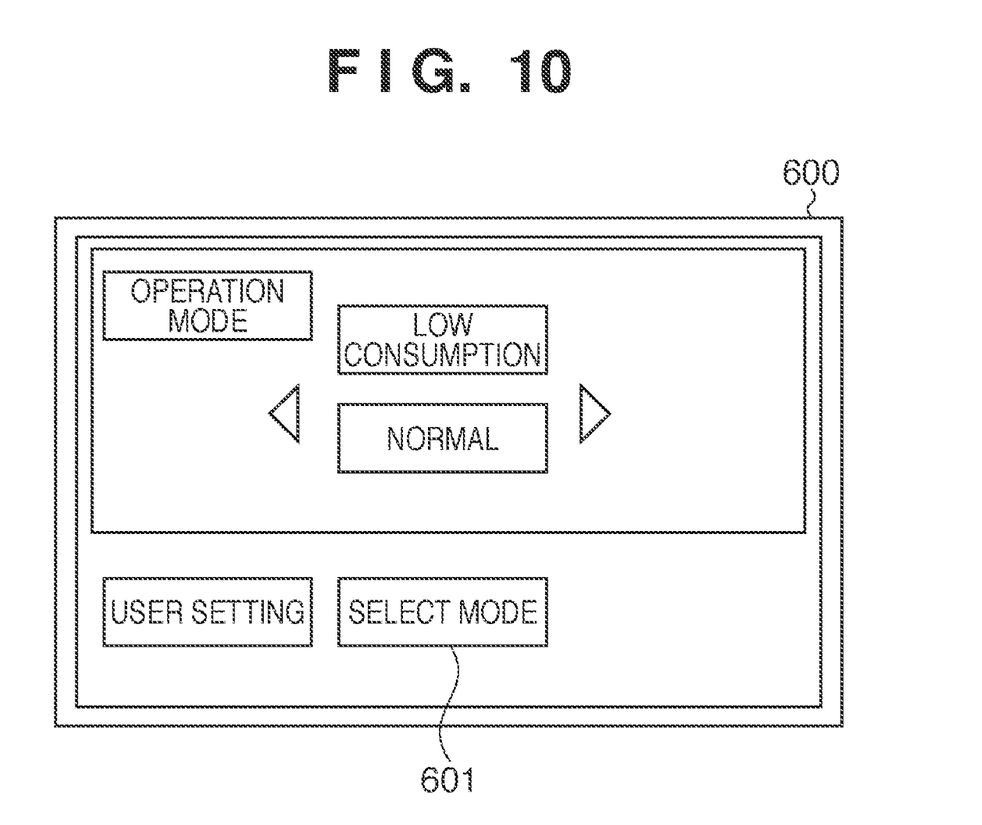
FIG. 10 is a view exemplifying a user interface.

FIG. 10 exemplifies the user interface. The user can select either the normal operation or low-consumption operation from the operation modes displayed on the user interface. When the user selects the power consumption-suppressed operation mode, that is, low-consumption operation, the display unit 102 in FIG. 1 transmits information of the low-power consumption cell selection request to the circuit device 206 via the CPU 201. The circuit device 206 accepts the low-power consumption cell selection request, reads circuit data formed from a low-power consumption cell from a recording medium 207, and starts writing it in the rewritable device.

It is also possible to define a default operation setting in advance, and when there is no selection notification from the user, determine an operation mode by giving priority to the default operation setting. In this case, the circuit device 206 selects circuit data defined as a default from circuit data recorded on the recording medium 207, and writes it in the rewritable device 203.

[Operation Sequence]

Figure 11:
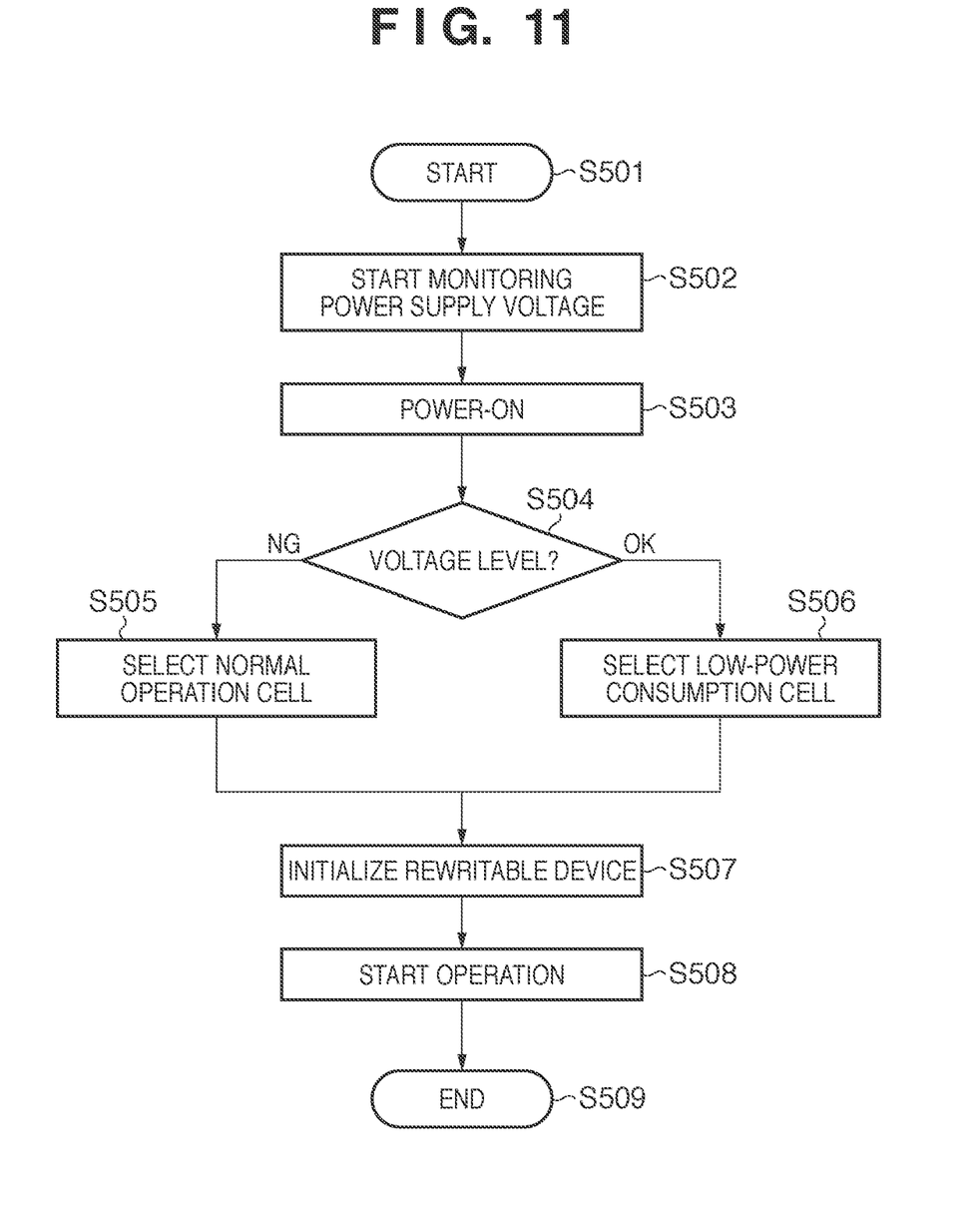
FIG. 11 is a flowchart of a circuit data rewrite method.

FIG. 11 shows an operation sequence according to the second embodiment. In S502, the circuit device 206 in FIG. 2 starts monitoring the power supply voltage of the rewritable device 203. In S503, the power supply circuit 202 in FIG. 2 starts supplying power supply voltages to the rewritable device 203.

In S504, the circuit device 206 monitors the level of each power supply voltage. If the voltage level falls within a range where the operation of the rewritable device 203 based on circuit data formed from a low-power consumption function cell is guaranteed, the circuit device 206 selects circuit data of a circuit arrangement using a low-power consumption function cell in S506. Alternatively, the display unit 102 in FIG. 1 notifies the user via the display that the power consumption-suppressed operation mode is usable. If the user selects an operation using a normal operation cell, the circuit device 206 selects circuit data formed from a normal operation function cell in S505.

In S507, the circuit device 206 initializes the rewritable device 203 based on the selected circuit data. In the initialization, the selected circuit data is written in the rewritable device, mounting a desired circuit arrangement. After the end of the initialization, the rewritable device 203 starts the operation in S508.

As described above, the second embodiment adopts a user interface which notifies the user that a power consumption-suppressed operation mode is possible, and allows him to select whether to use a power consumption-suppressed operation mode. The second embodiment can provide a flexible power supply voltage selection for the user.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-298828 filed Dec. 28, 2009 which is hereby incorporated by reference herein in its entirety.

What is claimed is:

1. An image processing apparatus including a processing unit having a rewritable circuit arrangement, comprising:
   a supply unit which supplies a voltage to the processing unit;
   a storage unit which stores circuit data which is to be written in the processing unit, to cause the processing unit to implement a circuit operation based on the circuit data;
   a measurement unit which measures a magnitude of the voltage supplied from said supply unit to the processing unit; and
   a control unit which rewrites the circuit arrangement of the processing unit by writing the circuit data read from said storage unit in the processing unit in accordance with the magnitude of the voltage that is measured by said measurement unit.

2. The apparatus according to claim 1, wherein
   the processing unit includes one cell,
   said supply unit supplies a voltage to said one cell,
   said measurement unit measures a magnitude of a voltage supplied from said supply unit to said one cell, and
   said control unit rewrites a circuit arrangement of said one cell in accordance with the magnitude of the voltage that is measured by said measurement unit.

3. The apparatus according to claim 1, wherein
   the processing unit includes a plurality of function cells,
   said supply unit supplies voltages to the plurality of function cells,
   said measurement unit measures a magnitude of a voltage supplied from said supply unit to each of the plurality of function cells, and
   said control unit rewrites a circuit arrangement of each of the plurality of function cells in accordance with the magnitude of the voltage that is measured by said measurement unit.

4. A non-transitory computer-readable storage medium storing a computer program for causing a computer to function as each unit of an image processing apparatus defined in claim 1.

5. The apparatus according to claim 1, wherein said storage unit stores first circuit data and second circuit data, wherein the first circuit data is written in the processing unit to cause the processing unit to implement a circuit operation based on the first circuit data, wherein the second circuit data is written in the processing unit to cause the processing unit to implement a circuit operation based on the second circuit data, and
   wherein said control unit rewrites the circuit arrangement of the processing unit by writing the first circuit data in the processing unit when the measured magnitude is equal to or more than a first threshold, and said control unit rewrites the circuit arrangement of the processing unit by writing the second circuit data in the processing unit when the measured magnitude is less than the first threshold.

6. The apparatus according to claim 1, wherein the processing unit includes an I/O function cell for inputting/outputting data,
   wherein said storage unit stores I/O circuit data which is to be written in the processing unit to operate only the I/O function cell, and
   wherein said control unit rewrites the circuit arrangement of the processing unit by writing the I/O circuit data in the processing unit when the measured magnitude is less than a second threshold.

7. A method of controlling an image processing apparatus including a processing unit having a rewritable circuit arrangement, comprising:
   a supply step of supplying a voltage to the processing unit;
   a storage step of storing circuit data which is to be written in the processing unit, to cause the processing unit to implement a circuit operation based on the circuit data;
   a measurement step of measuring a magnitude of the voltage supplied to the processing unit in the supply step; and
   a control step of rewriting the circuit arrangement of the processing unit by writing the stored circuit data in the processing unit in accordance with the magnitude of the voltage that is measured in the measurement step.

* * * * *